United States Patent
Togino et al.

[11] Patent Number: 5,448,408
[45] Date of Patent: Sep. 5, 1995

[54] PROJECTION LENS SYSTEM

[75] Inventors: Takayoshi Togino, Tokyo; Yoshiko Tezuka, Iruma, both of Japan

[73] Assignee: Olympus Optical Co., Ltd., Tokyo, Japan

[21] Appl. No.: 148,351

[22] Filed: Nov. 8, 1993

Related U.S. Application Data

[62] Division of Ser. No. 780,339, Oct. 22, 1991, Pat. No. 5,260,832.

[30] Foreign Application Priority Data

Oct. 22, 1990 [JP] Japan ................... 2-283827

[51] Int. Cl.⁶ ............................................ G02B 3/00
[52] U.S. Cl. ................... 359/651; 359/650; 359/679
[58] Field of Search ............... 359/679, 649, 650, 651

[56] References Cited

FOREIGN PATENT DOCUMENTS 60-195509  4/1985  Japan.

Primary Examiner—Georgia Y. Epps
Assistant Examiner—Thomas Robbins
Attorney, Agent, or Firm—Cushman, Darby & Cushman

[57] ABSTRACT

This invention relates to a projection lens system used for transferring circuit or other patterns from masks, etc. on which the circuit patterns are drawn onto semiconductor wafers by projection photolithography, and provides a projection lens system which makes high resolving power of the order of a few micrometers and wide exposure coverages compatible with each other.

This projection lens system includes at least two sets of lens groups, each built up of lenses having concave surfaces located opposite to each other, and includes at least one lens surface of positive refractive power between said two sets of lens groups, said two sets of lens groups all satisfying the following conditions:

$$1/L < |\phi_1| < 20/L \tag{1}$$

$$1/L < |\phi_2| < 20/L \tag{2}$$

wherein $\phi_1$ and $\phi_2$ stand for the respective negative refractive powers of said oppositely located concave surfaces, and L is the distance between object and image.

36 Claims, 12 Drawing Sheets

N.A.
Spherical aberration

Image height
Astigmatic difference

Image height
Image distortion (%)

N.A.
Image height 0

N.A.
Image height 26.3

N.A.
Image height 37.5

Comae

N.A.
0.2
−0.050  0  0.050
Spherical aberration

Image height
30.6
−0.050  0  0.050
Astigmatic difference

Image height
44
−0.010  0  0.010
Image distortion (%)

N.A.
0.1
−0.0100  0.0100
Image height
0

N.A.
0.1
−0.0100  0.0100
Image height
30.6

N.A.
0.1
−0.0100  0.0100
image height
44

Comae

N.A.
Spherical aberration

Image height
Astigmatic difference

Image height
Image distortion (%)

N.A.
Image height 0

N.A.
Image height 35

N.A.
Image height 50

Comae

N.A.
0.42

−0.0050　0　0.0050
Spherical aberration

Image height
17.6

−0.02　0　0.02
Astigmatic difference

Image height
17.6

−0.010　0　0.010
Image distortion (%)

N.A.
0.42

−0.0100　0.0100

Image height
0

N.A.
0.42

−0.0100　0.0100

Image height
12.3

N.A.
0.42

−0.0100　0.0100

Image height
17.6

Comae

N.A.
0.55

-0.0050　0　0.0050
Spherical
aberration

Image height
17.8

-0.008　0　0.008
Astigmatic
difference

Image height
17.8

-0.010　0　0.010
Image distortion
(%)

N.A.
0.55

-0.0100　0.0100

Image height
0

N.A.
0.55

-0.0100　0.0100

Image height
12.4

N.A.
0.55

-0.0100　0.0100

Image height
17.8

Comae

N.A.
0.45

-0.0050  0  0.0050
Spherical
aberration

Image height
20.8

-0.0050  0  0.0050
Astigmatic
difference

Image height
20.8

-0.010  0  0.010
Image distortion
(%)

N.A.
0.45

-0.0100  0.0100

Image height
0

N.A.
0.45

-0.0100  0.0100

Image height
14.5

N.A.
0.45

-0.0100  0.0100

Image height
20.8

Comae

N.A

Image height

Image height

N.A

N.A.

N.A.

Comae

N.A.
0.48
-0.002  0  0.002
Spherical
aberration

Image height
16.1
-0.0050  0  0.0050
Astigmatic
difference

Image height
16.1
-0.010  0  0.010
Image distortion
(%)

N.A.
0.48
-0.0100  0.0100
Image height
0

N.A.
0.48
-0.0100  0.0100
Image height
11.3

N.A.
0.48
-0.0100  0.0100
Image height
16.1

Comae

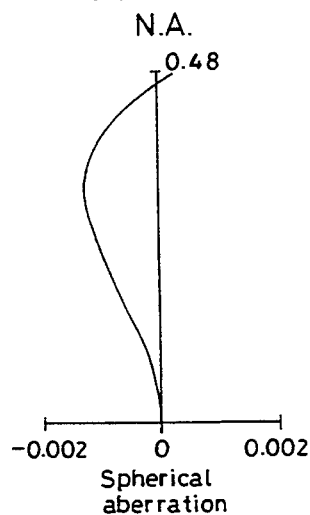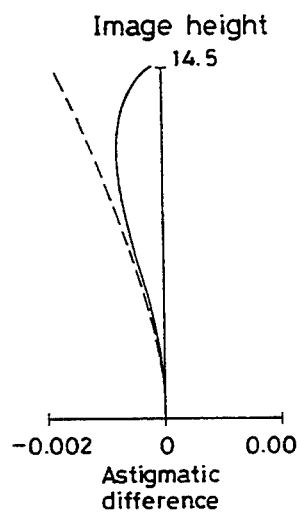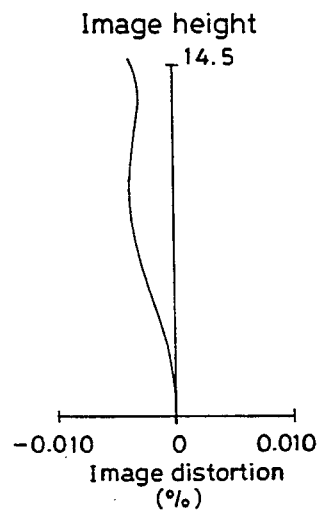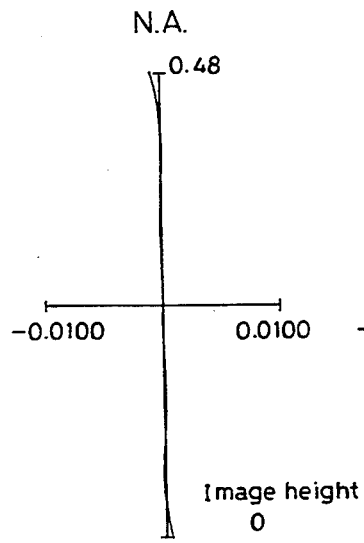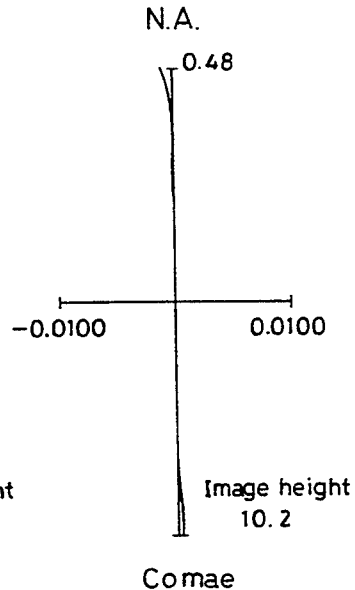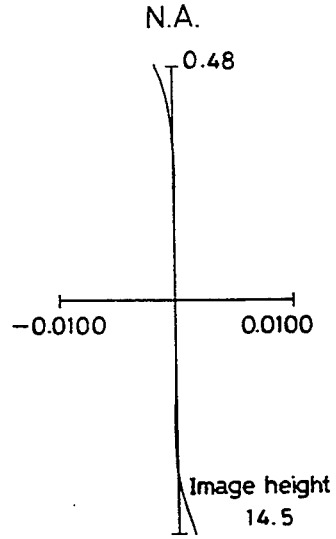

PROJECTION LENS SYSTEM

This is a division of application Ser. No. 07/780,339, filed Oct. 22, 1991, U.S. Pat. No. 5,260,832.

BACKGROUND OF THE INVENTION

The present invention relates to a projection lens system used for transferring circuit or other patterns onto semiconductor wafers through masks, etc.—on which the circuit patterns are drawn—by projection photolithography.

So far, transfer of desired patterns onto integrated circuits such as ICs and LSIs or flat displays built up of liquid crystals has been achieved by non-contact photolithography called the proximity technique or reflecting photolithography called the aligner technique.

Of these, the proximity technique is designed to locate a mask in close proximity to a semiconductor wafer and transfer a circuit pattern drawn on the mask onto the wafer, as set forth in Japanese Provisional Patent Publication No. 50(1975)-115774. In this technique, it is a slight space between the mask and the substrate onto which the pattern is to be transferred that determines transfer resolving power; this space must be very narrow when transfer is to be carried out with high resolving power. However, when the mask is located in too close proximity to or in contact with the substrate, the circuit pattern transferred onto the substrate would be impaired.

In the aligner technique, on the other hand, pattern resolving powers are determined by imagewise numerical aperture, because masks are adapted to be projected onto wafers through a reflecting optical system, as disclosed in Japanese Provisional Patent Publication No. 63(1988)-184328. However, this technique again offers a problem in that no high resolving power can be obtained, because it is impossible to increase the imagewise numerical aperture for the reason that the reflecting optical system is usually an equimultiple one. As the region to be exposed to light, i.e., the image surface increases in area, there is an increase in the expansion of a semiconductor substrate due to the heat of projected light; transfer must be carried out after the alignment of the circuit pattern size by fine adjustment of projecting magnification. However, a major problem with the aligner technique is that a pattern of large size cannot be projected at one time, because it is in principle difficult to vary the projecting magnification in alignment with the expansion of the substrate. In order to solve these problems, the step-and-repeat photolithographic technique with demagnification has been mainly used in recent years. As set forth in Japanese Provisional Patent Publication No. 60(1985)-195509 and other literature, this technique is designed to project masks onto wafers with suitable demagnification (on the scale of ca. 1 to 2, 3, . . . ) for pattern transfer. This technique enables projecting magnifications to be arbitrarily varied by fine adjustment of a distance between the mask on which a circuit pattern is drawn and the projected image (substrate) and makes it easy to enhance resolving powers by affording a large value for the imagewise numerical aperture of a projection lens, and so will be increasingly used from now on.

However, conventional projection lens systems available with this technique have been found to fall to satisfy both high resolving power (i.e., large numerical aperture) and wide exposure coverages (image heights).

SUMMARY OF THE INVENTION

A principal object of this invention is to provide a projection lens system which makes high resolving power on the order of a few micrometers and wide exposure coverages compatible with each other.

The projection lens system according to this invention is characterized by including at least two sets of lens groups, each built up of lenses whose concave surfaces are opposite to each other, and including at least one lens surface having positive refractive power between the two sets of lens groups.

Referring more specifically to this invention, the curvature of field need be almost completely corrected so as to achieve high resolving power and wide exposure coverages concurrently. As well known in the art, the curvature of field has close relations to the Petzval's sum; the smaller the Petzval's sum the smaller the curvature of field, thus achieving wide exposure coverages. Although it is known that lens arrays having concave surfaces located in opposition to each other may be used as means for correcting the Petzval's sum, difficulty would be encountered in correcting the Petzval's sum with one such array of lenses. The reason is that it may be possible to decrease the Petzval's sum by increasing the negative refractive powers of the oppositely located concave surfaces; however, when the concave surfaces have too high powers, comae occurring thereon are too large to make corrections by other surfaces.

Now, the use of two sets of lens groups, each having concave surfaces located opposite to each other, is envisaged. A problem with such an arrangement, however, is that only the lens group having its concave surfaces giving out divergent bundles of rays are so locally positioned on part of the lens system that there can be no choice but to diminish the negative refractive powers of such concave surfaces so as to allow the refractive power of the overall lens system to get a given value. More exactly, the oppositely located concave surfaces act to decrease the Petzval's sum increase in number, but it is nonetheless impossible to decrease the Petzval's sum because the respective concave surfaces are less capable of making corrections.

According to this invention accomplished with the foregoing in mind, at least one lens surface having positive refractive power is positioned between two sets of lens groups, each having concave surfaces located opposite to each other, thereby making an effective contribution to correcting the Petzval's sum. With this arrangement wherein the two sets of lens groups, each having concave surfaces located opposite to each other, are coaxially positioned with the lens surface having positive refractive power disposed therebetween, the respective concave surfaces of each lens group are allowed to have suitable refractive powers with respect to the Petzval's sum and comae. The "suitable refractive powers" referred to in this disclosure satisfy the following conditions:

$$1/L < |\phi_1| < 20/L \qquad (1)$$

$$1/L < |\phi_2| < 20/L \qquad (2)$$

wherein $\phi_1$ and $\phi_2$ stand for the respective negative refractive powers of the concave surfaces located opposite to each other, and L is the distance between object and image.

At above the upper limits of these conditions, the negative refractive powers of the concave surfaces are too low to make sufficient corrections on the Petzval's sum, leaving behind some curvature of field and so rendering it possible to obtain wide exposure coverages. At below the lower limits, the negative refractive powers are so increased that the Petzval's sum can be corrected, but difficulty is involved in making corrections by other surfaces due to the occurrence of excessive comas.

In order to prevent partial image distortions which may otherwise occur depending upon the flatness of the substrate, it is desired to set up a so-called telecentric system wherein the imagewise exit pupil is designed to lie in the vicinity of the infinite point. According to this invention, a positive lens group is disposed on the image surface of the two sets of lens groups, each built up of concave surfaces located opposite to each other, so as to allow the imagewise exit pupil to lie in the vicinity of the infinite point. This is to focus the exit pupil in the lens system on the infinite point.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 10A to 10F through 18A to 18F are aberration curve diagrams of the 1st to 9th embodiments.

DESCRIPTION OF THE PREFERRED EMBODIMENTS

Some embodiments of the projection lens system according to this Invention will now be explained at great length with reference to the drawings.

Figure 1:
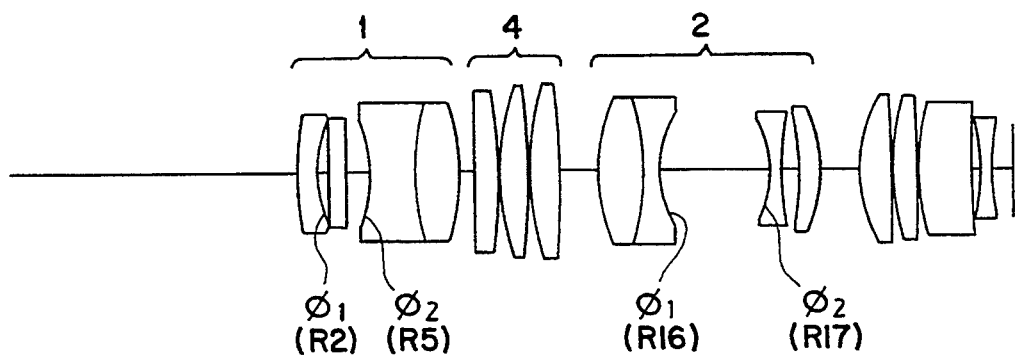
FIGS. 1 to 9 are sectional views showing lens arrangements of the first to ninth embodiments of this invention.

FIG. 1 is a sectional view showing the lens arrangement of the 1st embodiment, wherein the second and fifth surfaces R2 and R5 and the 16th and 17th surfaces R16 and R17 define oppositely located concave surfaces (shown by $\phi_1$ and $\phi_2$ in the drawing). The 2nd and 5th surfaces R2 and R5 are shown to include a lens of moderate power therebetween, but according to this invention there may be included a lens component of simple structure between the "lens groups, each having concave surfaces located opposite to each other". This lens system is a projection lens with demagnification on a one-to-two scale.

Figure 2:
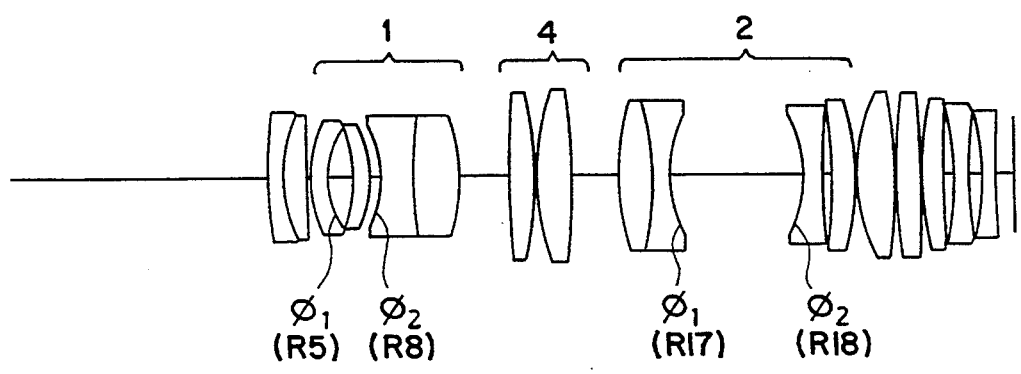

FIG. 2 is a sectional view showing a lens arrangement of the 2nd embodiment, wherein the 5th and 8th surfaces R5 and R8 and the 17th and 18th surfaces R17 and R18 define oppositely disposed concave surfaces. This lens system is again a projection lens with demagnification on a one-to-two scale.

Figure 3:
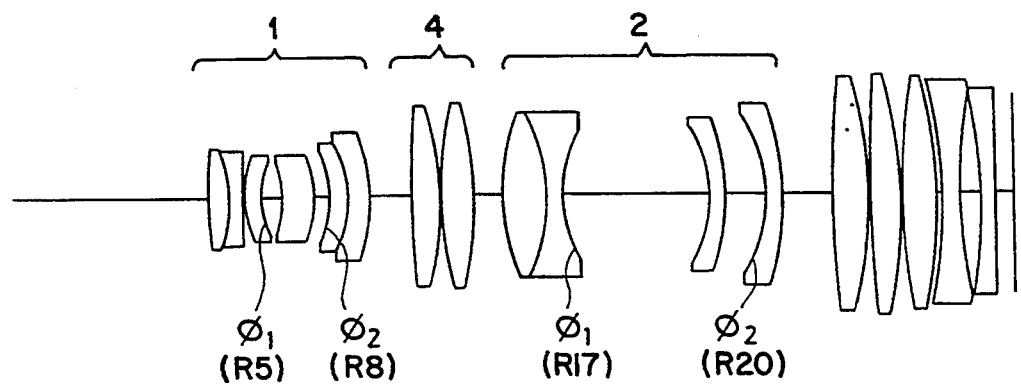

FIG. 3 is a sectional view showing a lens arrangement of the 3rd embodiment, wherein the 5th and 8th surfaces R5 and R8 and the 17th and 20th surfaces R17 and R20 define oppositely disposed concave surfaces. This lens system is an equimultiple projection lens.

All these embodiments are characterized by including a lens group of positive refractive power, built up of at least two lens of positive refract ire powers, between two sets of lens groups, each built up of oppositely disposed concave surfaces, and by meeting the following condition:

$$f < L/4 \qquad (3)$$

wherein f is the composite focal length and L is the distance between object and image. This condition implies that unless the lens group of positive refractive power has a certain or higher refractive power, some difficulty is encountered in making satisfactory aberration corrections. Since the respective lens groups, each built up of oppositely disposed concave surfaces, have increased negative refractive powers, the lens group of positive refractive power sandwiched therebetween are located at a position at which marginal rays stand high. The higher the position of a lens where marginal rays stand high, the more it is likely to have an influence on the focal length of the overall lens system, thus allowing the refractive power of the overall system to be born by this lens group of positive refractive power. For that reason, when the positive refractive power of the lens group having positive refractive power diminishes out of condition, it is impossible to increase the refractive powers of the oppositely disposed concave surfaces of the two sets of lens groups; it is impossible to decrease the Petzval's sum.

In each of these embodiments, the imagewise lens group of the lens groups, each built up of oppositely disposed concave surfaces, includes at least three lenses of positive refractive powers and at least one lens of negative refractive power so as to achieve a telecentric system on the image side. Such positive and negative lenses are needed to make satisfactory corrections on spherical aberrations when the pupil in the lens system is focused on the infinite point. For instance, when this group comprises one single lens, the angle of inclination of exit rays is made large by image heights because the spherical aberration of the pupil cannot be well corrected. Thus, when image surfaces are moving to-and-fro in the focal depth, image distortions vary seriously.

Figure 4:
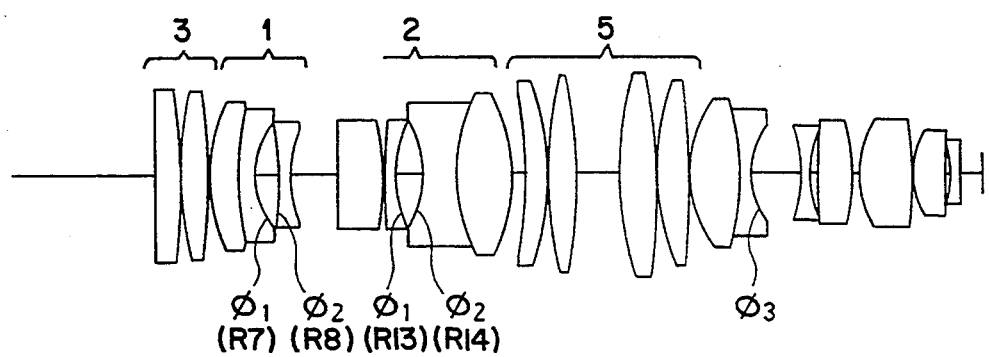

FIG. 4 is a sectional view showing a lens arrangement of the 4th embodiment, wherein the 7th and 8th surfaces R7 and R8 and the 13th and 14th surfaces R13 and 14 define oppositely disposed concave surfaces.

Figure 5:
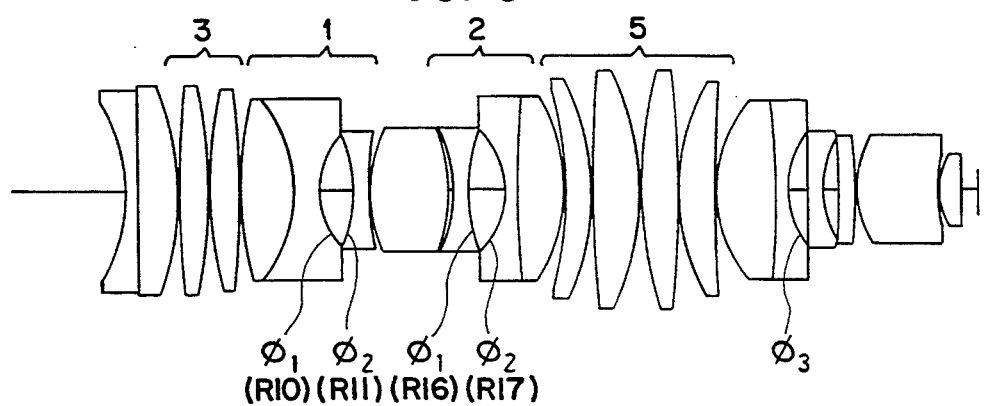

FIG. 5 is a sectional view showing a lens arrangement of the 5th embodiment, wherein the 10th and 11th surfaces R10 and R11 and the 16th and 17th surfaces R16 and 17 define oppositely disposed concave surfaces.

Figure 6:
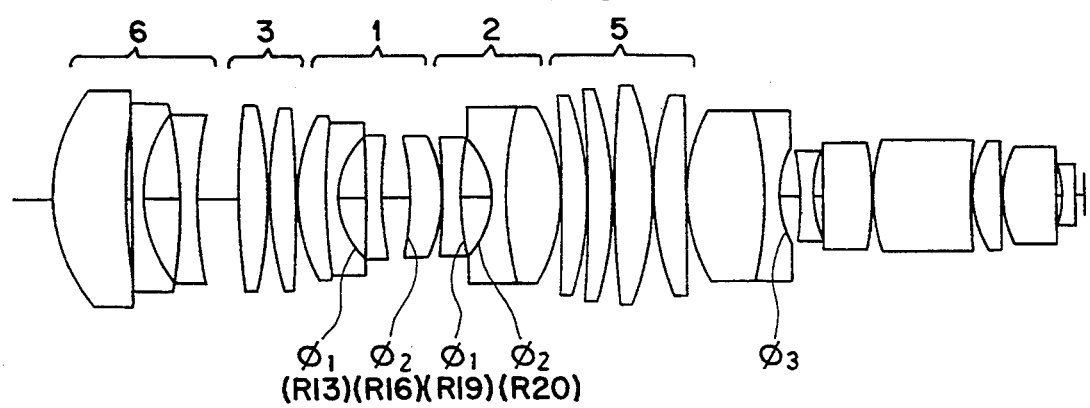

FIG. 6 is a sectional view showing a lens arrangement of the 6th embodiment, wherein the 13th and 16th surfaces R13 and R16 and the 19th and 20th surfaces R19 and R20 define oppositely disposed concave surfaces.

Figure 7:
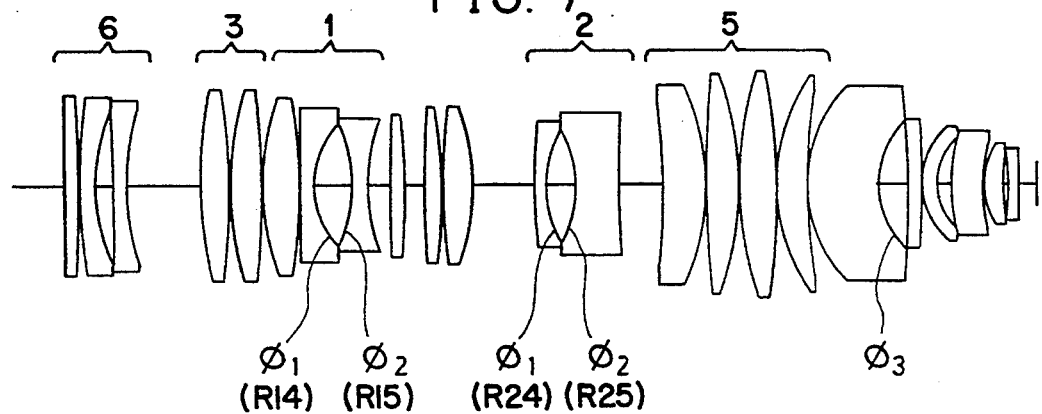

FIG. 7 is a sectional view showing a lens arrangement of the 7th embodiment, wherein the 14th and 15th surfaces R14 and R15 and the 24th and 25th surfaces R24 and R25 define oppositely disposed concave surfaces.

Figure 8:
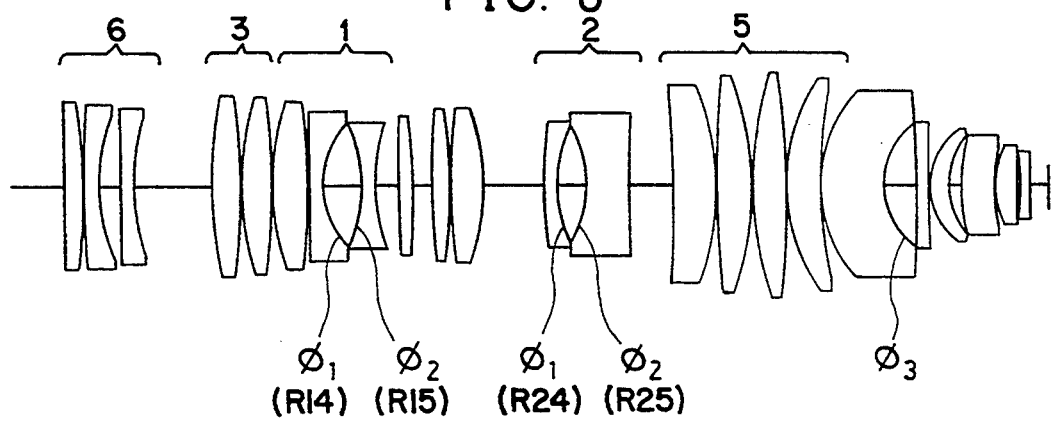

FIG. 8 is a sectional view showing a lens arrangement of the 8th embodiment, wherein the 14th and 15th surfaces R14 and R15 and the 24th and 25th surfaces R24 and R25 define oppositely disposed concave surfaces.

Figure 9:
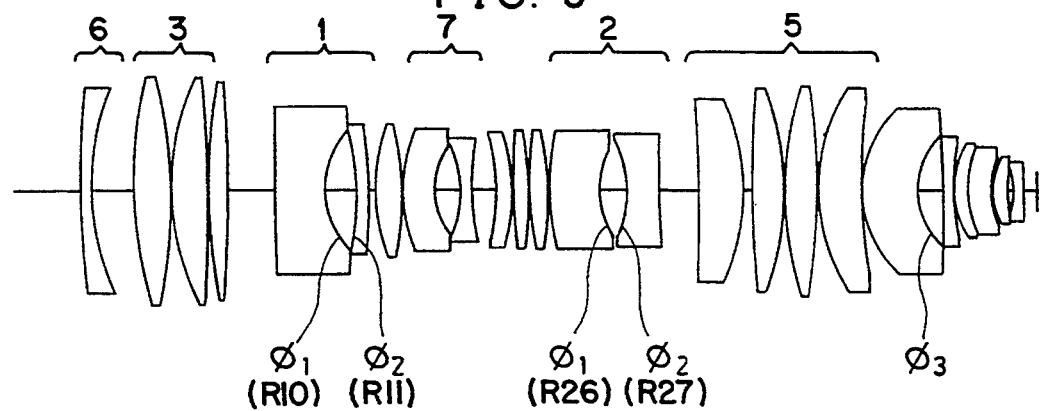
Figure 10A:
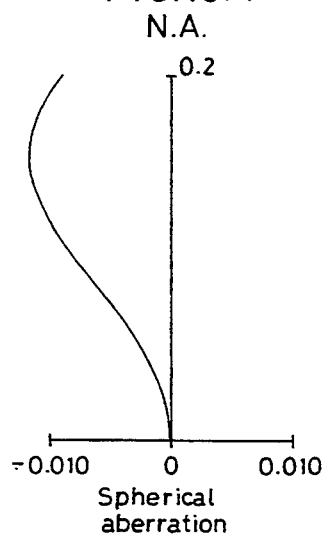
Figure 10B:
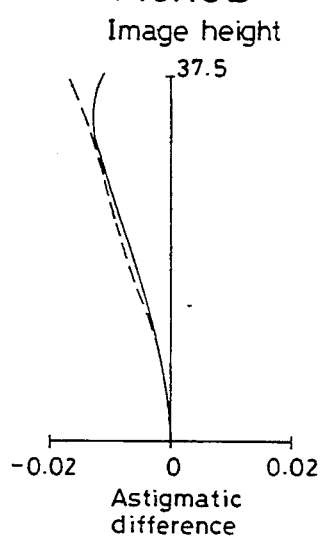
Figure 10C:
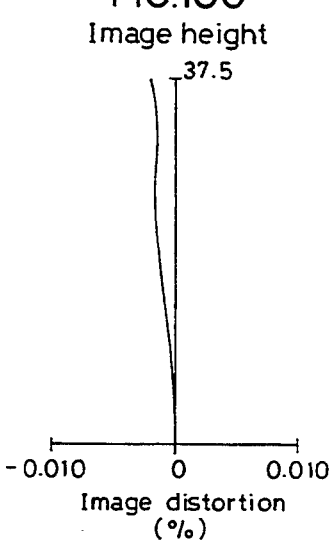
Figure 10D:
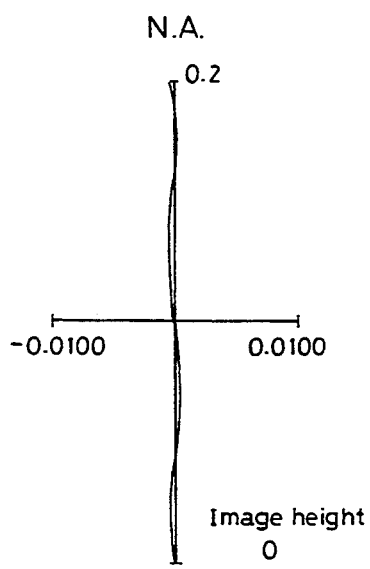
Figure 10E:
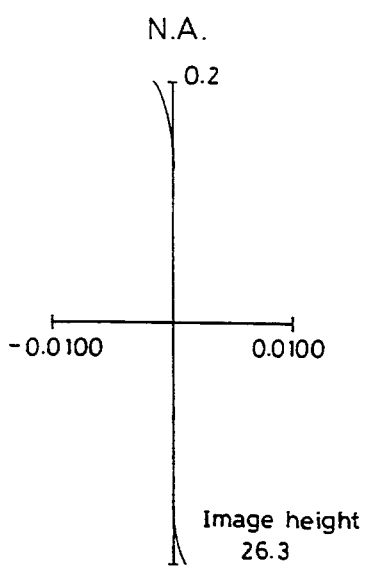
Figure 10F:
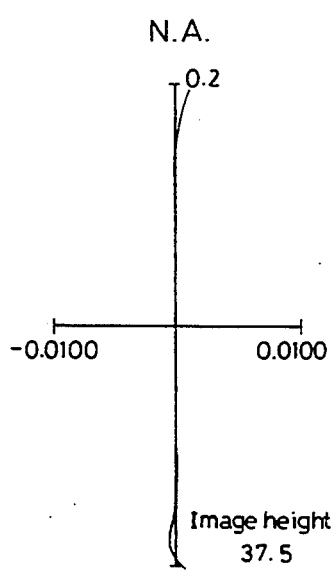
Figure 11A:
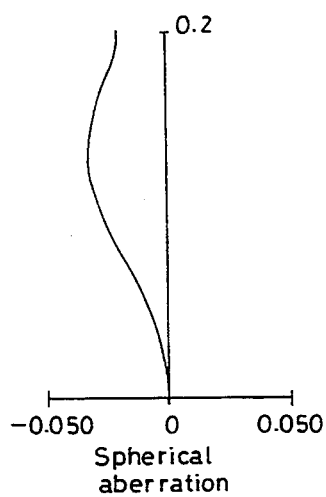
Figure 11B:
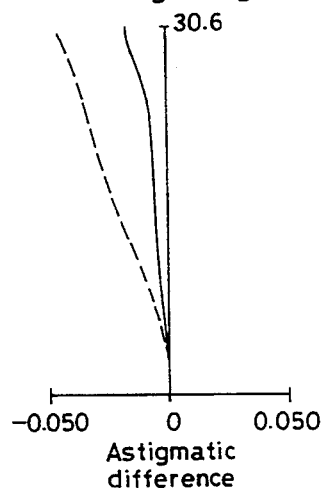
Figure 11C:
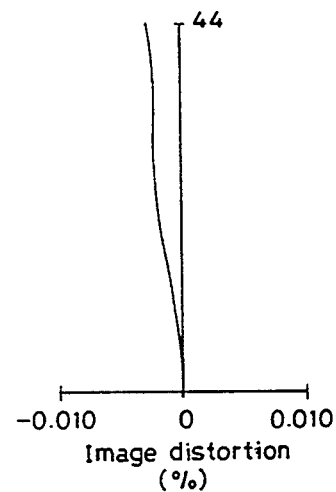
Figure 11D:
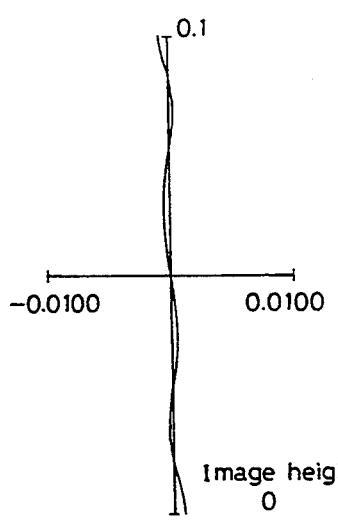
Figure 11E:
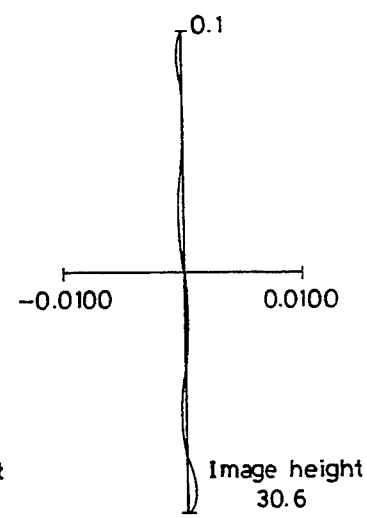
Figure 11F:
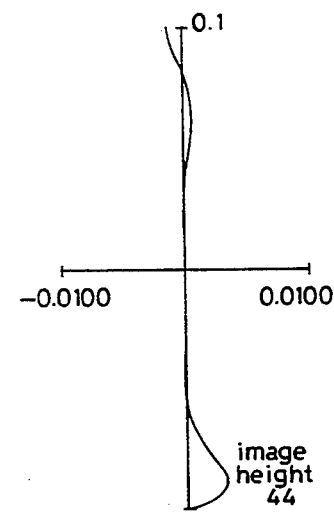
Figure 12A:
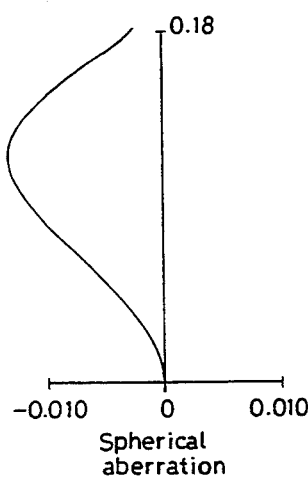
Figure 12B:
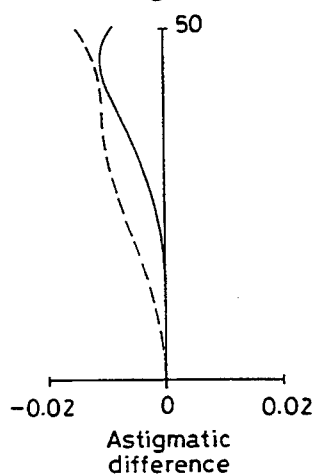
Figure 12C:
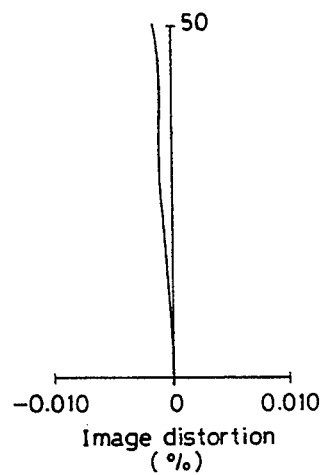
Figure 12D:
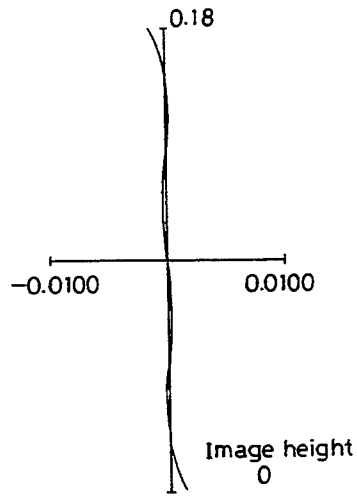
Figure 12E:
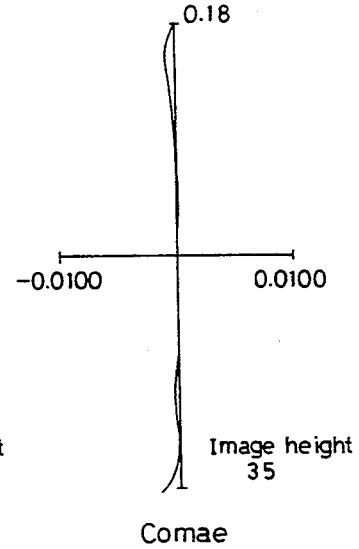
Figure 12F:
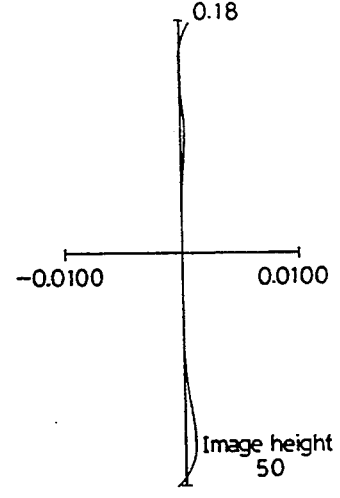
Figure 13A:
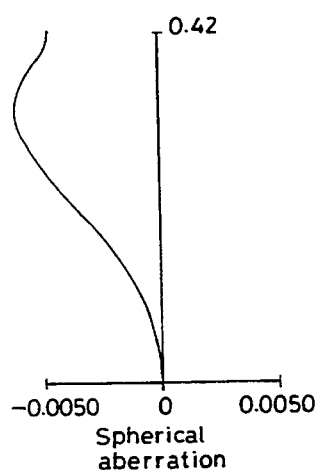
Figure 13B:
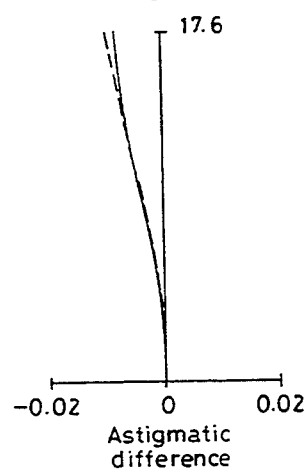
Figure 13C:
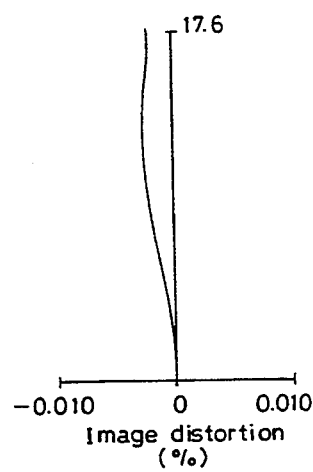
Figure 13D:
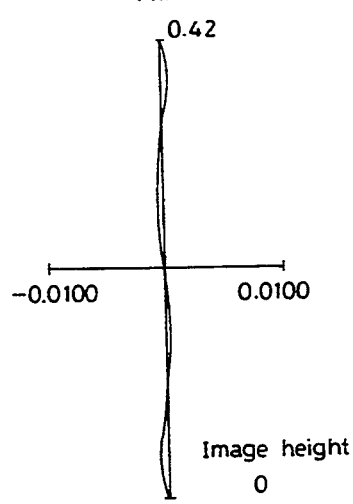
Figure 13E:
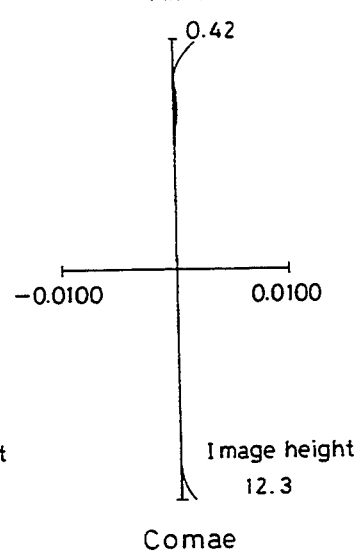
Figure 13F:
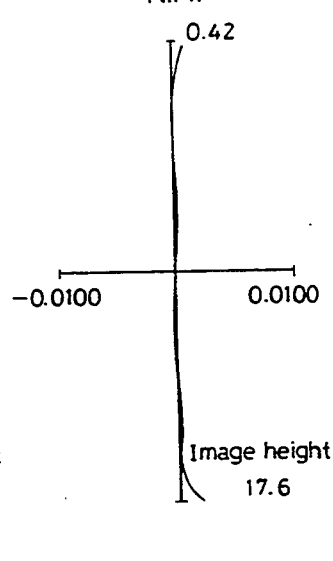
Figure 14A:
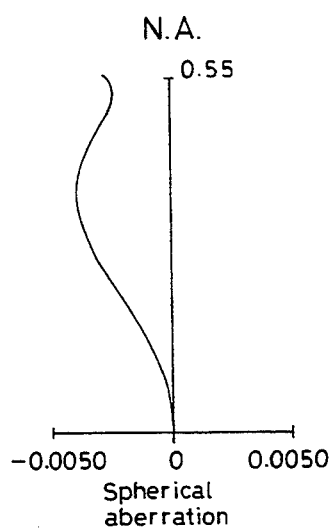
Figure 14B:
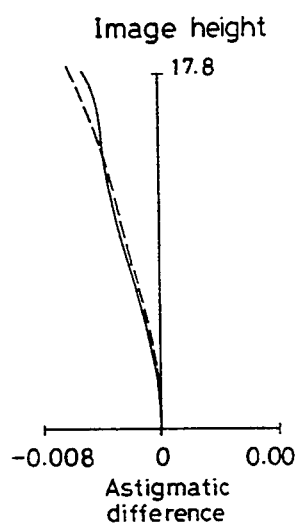
Figure 14C:
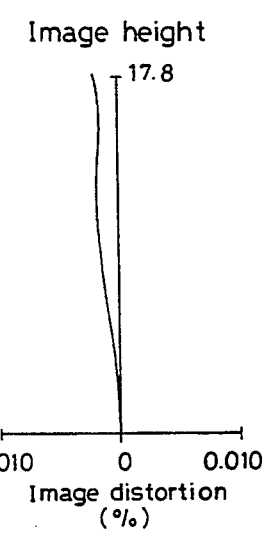
Figure 14D:
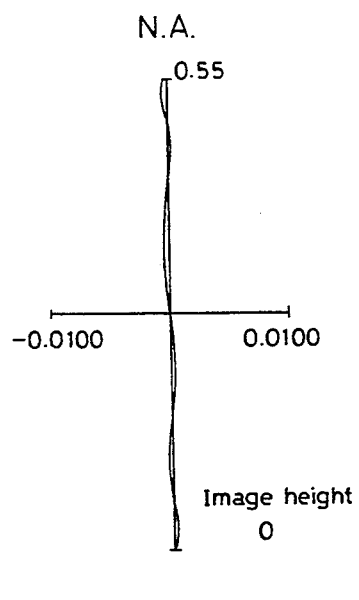
Figure 14E:
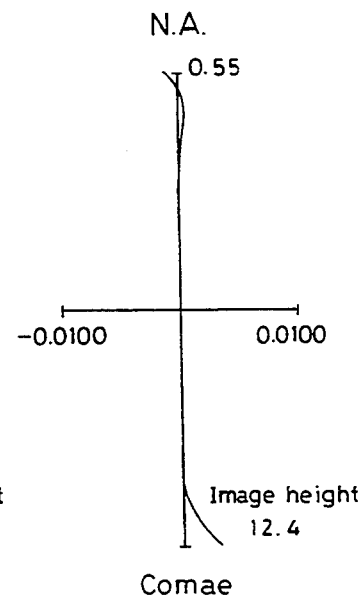
Figure 14F:
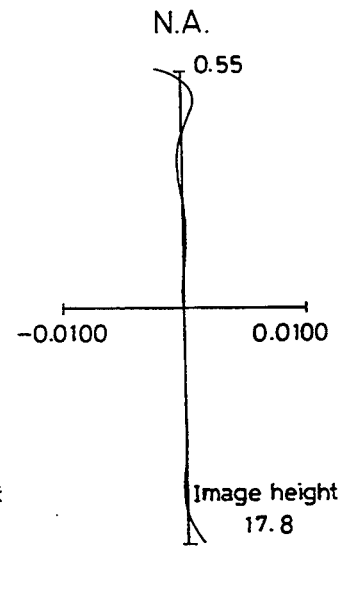
Figure 15A:
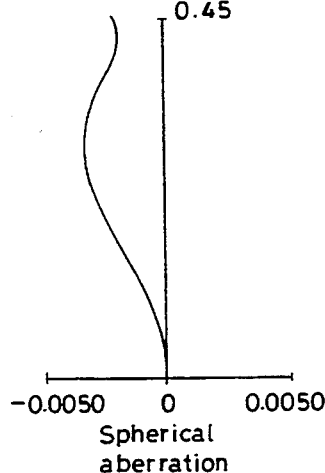
Figure 15B:
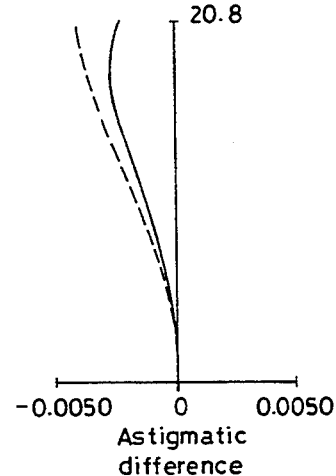
Figure 15C:
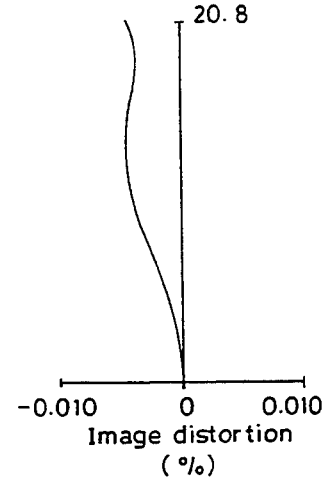
Figure 15D:
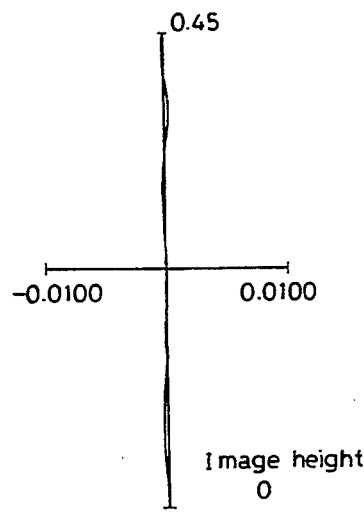
Figure 15E:
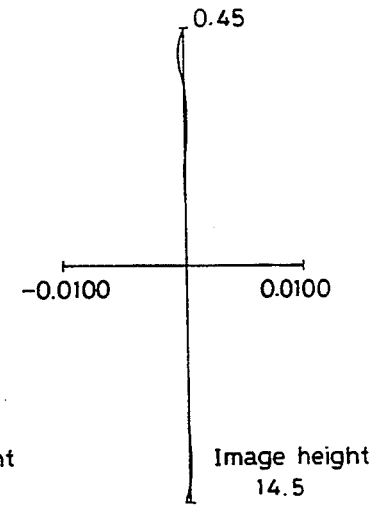
Figure 15F:
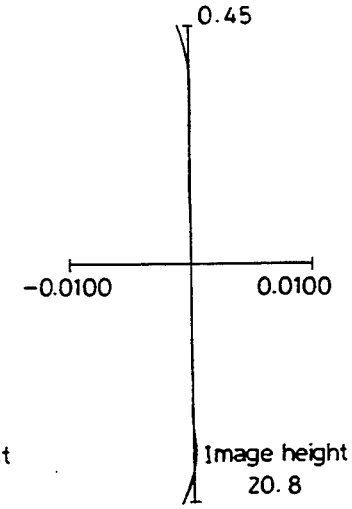
Figure 16A:
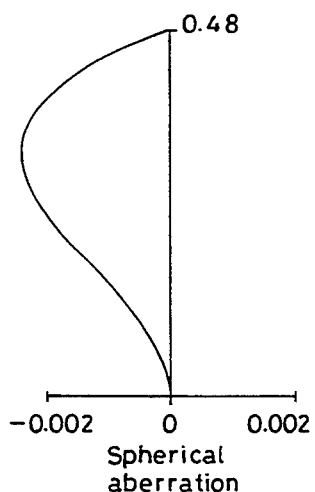
Figure 16B:
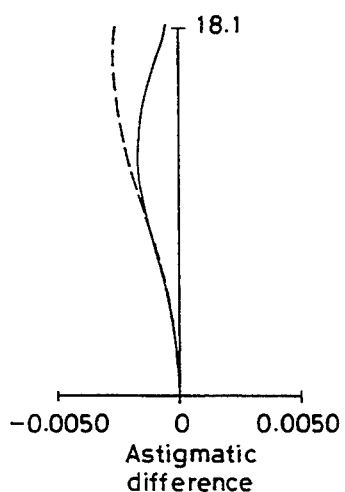
Figure 16C:
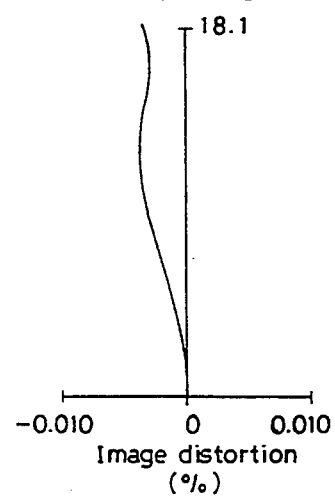
Figure 16D:
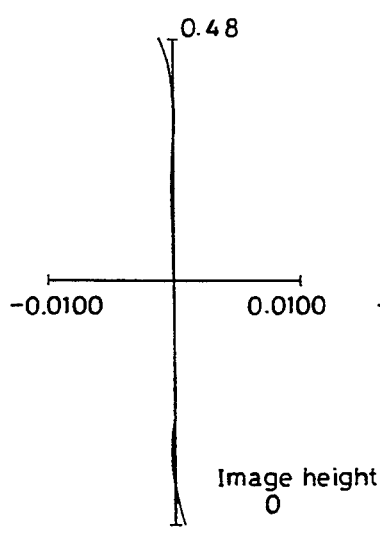
Figure 16E:
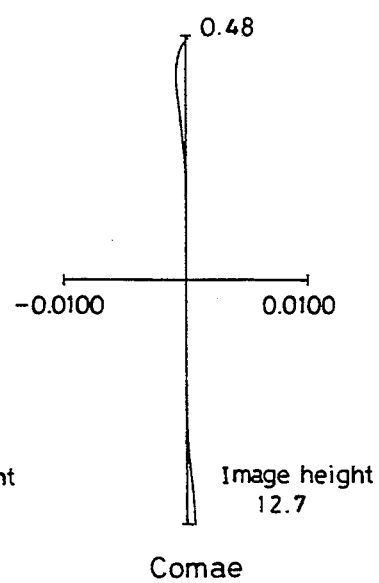
Figure 16F:
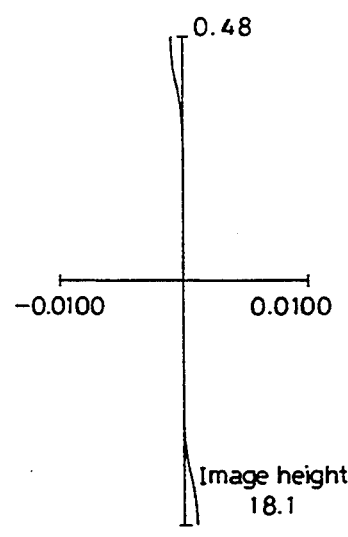
Figure 17A:
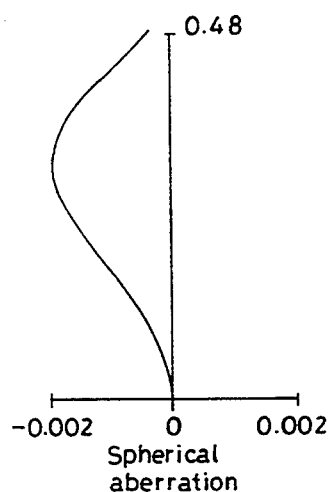
Figure 17B:
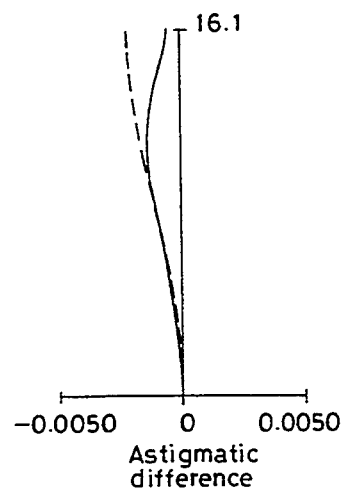
Figure 17C:
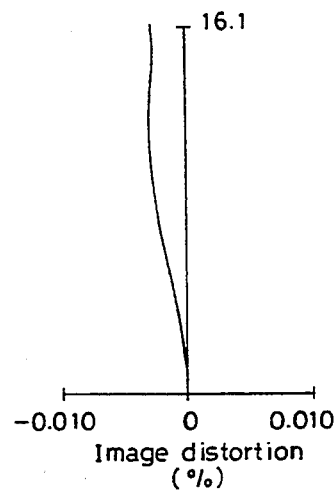
Figure 17D:
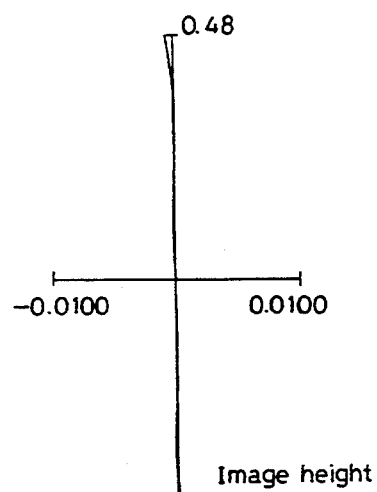
Figure 17E:
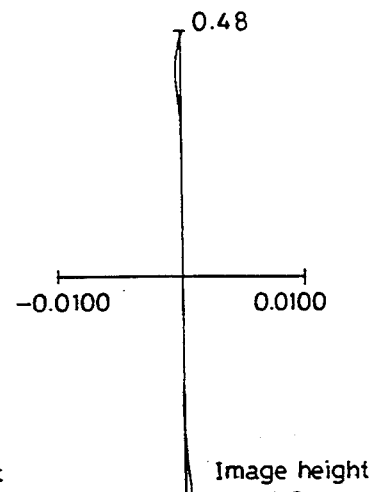
Figure 17F:
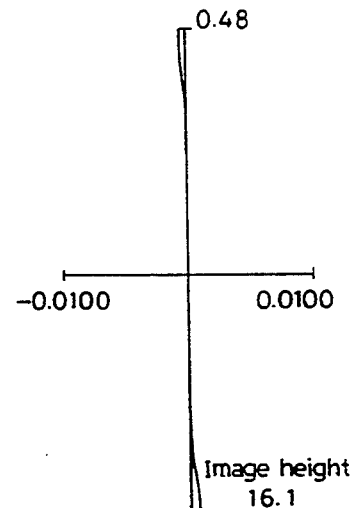

FIG. 9 is a sectional view showing a lens arrangement of the 9th embodiment, wherein the 10th and 11th surfaces R10 and R11, the 16th and 17th surfaces R16 and R17 and the 26th and 27th surfaces R26 and 27 define oppositely disposed concave surfaces.

The 4th–9th embodiments are all directed to projection lenses with demagnification on a one-to-five scale.

In the lens systems with demagnification on a one-to-five scale, the imagewise principal points of the lenses are closer to images than those in the 1st to 3rd embodiments. In other words, when a positive lens group of positive refractive power that constitutes a major power is located between two sets of lens groups, each comprising oppositely disposed concave surfaces, there is no space for providing a positive lens group to achieve a telecentric construction on the image side. This is because, in each of these embodiments, the two sets of lens groups, each built up of oppositely disposed concave surfaces, are located on the object side of the above-mentioned positive lens group that constitutes a major power of the lens system.

In order to obtain an imagewise numerical aperture (NA) of 0.4 or more, the above-mentioned positive lens group that constitutes a major power is built up of at least four lenses having positive refractive powers, whereby the amount of spherical aberrations caused by the positive lens group that constitutes a major power can be corrected by other lenses.

In order to correct the Petzval's sum more satisfactorily, a lens which has negative refractive power and the concave surface of which faces the image side is provided on the image side of the two sets of lens groups, each built up of oppositely disposed concave surfaces. Making the Petzval's sum good enough and obtaining wide exposure coverages are then achieved by satisfying the following condition:

$$1/L < |\phi_3| < 20/L \qquad (4)$$

wherein $\phi_3$ is the negative refractive power of the additional lens and L is the distance between object and image. The same as referred to in connection with Condition (1) again holds for the upper and lower limits of Condition (4). In order to afford pertinent values for the refractive powers of the two sets of lens groups, each built up of oppositely disposed concave surfaces, and make the amount of comae correctable by other lenses, a lens group built up of at least two lenses of positive refractive powers is disposed on the object side of the above-mentioned sets of lens groups. This lens group having positive refractive power makes it possible to lower the height of off-axial rays when they are incident on the oppositely disposed concave surfaces on the object side. When the incident rays are at a low height, comae are less likely to occur, because even though the oppositely disposed concave surfaces are increased in refractive power by decreasing their radii of curvature, there is a little, if any, difference in the angle of incidence upon the concave surfaces between the upper and lower components of off-axial dependent rays.

Referring to the 10th embodiment, the Petzval's sum is further decreased by using three sets of lens groups, each having concave surfaces disposed opposite to each other.

It is noted that the 7th to 9th embodiments are designed to be used with monochromatic light sources having a very close range of wavelengths, like laser, and are formed of a single glass material.

In each of these embodiments, an imagewise numerical aperture (NA) of 0.45 or more is obtained by disposing an additional lens group comprising at least one lens of negative refractive power on the object side of the lens group comprising at least two lenses of positive refractive powers, which has been disposed on the object side of the two sets of lens groups, each built up of oppositely disposed concave surfaces. This is to correct coma flares occurring on the lens group comprising at least two lenses of positive refractive powers, located on the above-mentioned object side. In addition, the positive refractive power of the lens group located between the two sets of lens groups, each built up of oppositely disposed concave surfaces, is increased to impart proper refractive powers to the oppositely disposed concave surfaces.

The 9th embodiment is constructed as a projection lens system made telecentric on both its sides, wherein the entrance pupil is set at the infinite point.

In the following examples, detailed data will be given.

| Example 1 | | |
|---|---|---|
| f = 211.48  NA = 0.2  IH = 37.5  L = 1000 | | |
| OB = 363.015  SK = 18.185  $\lambda$ = 436 nm | | |
| R1 = 290.079 | D1 = 17.500 | N1 = 1.69299 |
| R2 = 138.498 | D2 = 8.846 | |
| R3 = 507.317 | D3 = 17.500 | N2 = 1.71756 |
| R4 = ∞ | D4 = 21.215 | |
| R5 = −129.056 | D5 = 41.301 | N3 = 1.59953 |
| R6 = 239.801 | D6 = 39.464 | N4 = 1.52613 |
| R7 = −201.485 | D7 = 12.896 | |
| R8 = ∞ | D8 = 22.500 | N5 = 1.52613 |
| R9 = −394.840 | D9 = 1.250 | |
| R10 = 292.481 | D10 = 25.000 | N6 = 1.52613 |
| R11 = −610.192 | D11 = 1.250 | |
| R12 = 250.061 | D12 = 27.500 | N7 = 1.52613 |
| R13 = −746.631 | D13 = 35.913 | |
| R14 = 165.337 | D14 = 39.178 | N8 = 1.52613 |
| R15 = −178.430 | D15 = 13.750 | N9 = 1.59953 |
| R16 = 103.371 | D16 = 99.911 | |
| R17 = −97.752 | D17 = 10.000 | N10 = 1.54529 |
| R18 = 343.137 | D18 = 13.691 | |
| R19 = −341.327 | D19 = 18.750 | N11 = 1.71221 |
| R20 = −155.958 | D20 = 35.863 | |
| R21 = 132.625 | D21 = 27.500 | N12 = 1.52613 |
| R22 = ∞ | D22 = 1.250 | |
| R23 = 239.402 | D23 = 20.000 | N13 = 1.61529 |
| R24 = ∞ | D24 = 1.250 | |
| R25 = 219.047 | D25 = 48.519 | N14 = 1.61529 |
| R26 = ∞ | D26 = 7.014 | |
| R27 = −234.923 | D27 = 10.000 | N15 = 1.71756 |
| R28 = 259.518 | | |
| $\phi_1$ (R2) = −0.005, $\phi_2$ (R5) = −0.0046 | | |
| $\phi_1$ (R16) = −0.0058, $\phi_2$ (R17) = −0.0056 | | |

| Example 2 | | |
|---|---|---|
| f = 215.03  NA = 0.18  IH = 50  L = 1000 | | |
| OB = 336.094  SK = 15.000  $\lambda$ = 436 nm | | |
| R1 = 427.197 | D1 = 15.000 | N1 = 1.57082 |
| R2 = 147.578 | D2 = 19.888 | N2 = 1.62364 |
| R3 = ∞ | D3 = 3.750 | |
| R4 = 156.400 | D4 = 15.000 | N3 = 1.62364 |
| R5 = 95.679 | D5 = 23.118 | |
| R6 = −103.846 | D6 = 15.000 | N4 = 1.61529 |
| R7 = −90.413 | D7 = 9.643 | |
| R8 = −83.274 | D8 = 27.219 | N5 = 1.59953 |
| R9 = 426.489 | D9 = 43.157 | N6 = 1.52613 |
| R10 = −159.199 | D10 = 44.347 | |
| R11 = 825.646 | D11 = 22.442 | N7 = 1.63619 |
| R12 = −282.360 | D12 = 1.250 | |
| R13 = 227.045 | D13 = 31.218 | N8 = 1.61529 |
| R14 = −749.008 | D14 = 43.166 | |
| R15 = 184.718 | D15 = 30.140 | N9 = 1.52613 |
| R16 = −227.718 | D16 = 15.000 | N10 = 1.66362 |
| R17 = 133.563 | D17 = 121.146 | |
| R18 = −101.157 | D18 = 15.000 | N11 = 1.58406 |
| R19 = 875.000 | D19 = 8.592 | |
| R20 = −475.291 | D20 = 20.000 | N12 = 1.71221 |
| R21 = −214.958 | D21 = 1.250 | |
| R22 = 167.754 | D22 = 33.383 | N13 = 1.54529 |
| R23 = −449.144 | D23 = 1.250 | |
| R24 = 490.443 | D24 = 21.250 | N14 = 1.71221 |
| R25 = −847.568 | D25 = 1.250 | |
| R26 = 269.443 | D26 = 20.000 | N15 = 1.71221 |

-continued

| | | |
|---|---|---|
| R27 = ∞ | D27 = 7.338 | |
| R28 = −386.590 | D28 = 15.000 | N16 = 1.52613 |
| R29 = 875.000 | D29 = 11.610 | |
| R30 = −208.684 | D30 = 12.500 | N17 = 1.52613 |
| R31 = ∞ | | |

$\phi_1$ (R5) = −0.0065, $\phi_2$ (R8) = −0.0072,
$\phi_1$ (R17) = −0.005, $\phi_2$ (R18) = −0.0058

Example 3 f = 310.93   NA = 0.1   IH = 88   L = 1000
OB = 280.813   SK = 15.00   λ = 436 nm

| | | |
|---|---|---|
| R1 = 292.620 | D1 = 18.811 | N1 = 1.57082 |
| R2 = −159.166 | D2 = 15.000 | N2 = 1.62364 |
| R3 = −1869.713 | D3 = 1.250 | |
| R4 = 114.734 | D4 = 15.000 | N3 = 1.62364 |
| R5 = 81.531 | D5 = 19.319 | |
| R6 = −89.379 | D6 = 28.913 | N4 = 1.61529 |
| R7 = −87.779 | D7 = 14.214 | |
| R8 = −79.176 | D8 = 15.006 | N5 = 1.59953 |
| R9 = −87.304 | D9 = 21.379 | N6 = 1.52613 |
| R10 = −150.014 | D10 = 33.438 | |
| R11 = 712.082 | D11 = 24.950 | N7 = 1.63619 |
| R12 = −289.529 | D12 = 1.946 | |
| R13 = 321.409 | D13 = 31.266 | N8 = 1.61529 |
| R14 = −318.064 | D14 = 26.097 | |
| R15 = 194.500 | D15 = 39.408 | N9 = 1.52613 |
| R16 = −161.670 | D16 = 15.251 | |
| R17 = 133.903 | D17 = 131.310 | N10 = 1.66362 |
| R18 = −113.561 | D18 = 15.000 | N11 = 1.58406 |
| R19 = −175.912 | D19 = 35.716 | |
| R20 = −122.171 | D20 = 15.000 | N12 = 1.71221 |
| R21 = −232.823 | D21 = 42.036 | |
| R22 = 778.470 | D22 = 31.449 | N13 = 1.54529 |
| R23 = −356.749 | D23 = 1.250 | |
| R24 = 1086.864 | D24 = 27.302 | N14 = 1.71221 |
| R25 = −450.133 | D25 = 1.250 | |
| R26 = 489.065 | D26 = 30.751 | N15 = 1.71221 |
| R27 = −488.224 | D27 = 4.415 | |
| R28 = −402.456 | D28 = 15.000 | N16 = 1.52613 |
| R29 = 486.544 | D29 = 19.965 | |
| R30 = −461.652 | D30 = 12.500 | N17 = 1.52613 |
| R31 = ∞ | | |

$\phi_1$ (R5) = −0.0076, $\phi_2$ (R8) = −0.0076,
$\phi_1$ (R17) = −0.00495, $\phi_2$ (R20) = −0.0058

Example 4 f = 131.35   NA = 0.42   IH = 17.6   L = 1000
OB = 233.494   SK = 19.762   λ = 365 nm

| | | |
|---|---|---|
| R1 = ∞ | D1 = 25.014 | N1 = 1.66650 |
| R2 = −540.172 | D2 = 0.502 | |
| R3 = 314.013 | D3 = 23.561 | N2 = 1.53607 |
| R4 = −1052.536 | D4 = 0.500 | |
| R5 = 141.696 | D5 = 28.894 | N3 = 1.66650 |
| R6 = 250.725 | D6 = 16.200 | N4 = 1.62747 |
| R7 = 82.055 | D7 = 23.237 | |
| R8 = −248.492 | D8 = 9.743 | N5 = 1.53607 |
| R9 = 155.078 | D9 = 42.165 | |
| R10 = 1411.311 | D10 = 43.265 | N6 = 1.53607 |
| R11 = −197.016 | D11 = 0.720 | |
| R12 = 1887.223 | D12 = 9.992 | N7 = 1.53607 |
| R13 = 128.923 | D13 = 26.295 | |
| R14 = −83.854 | D14 = 29.985 | N8 = 1.63595 |
| R15 = 179.127 | D15 = 52.329 | N9 = 1.53607 |
| R16 = −153.936 | D16 = 12.067 | |
| R17 = −405.392 | D17 = 21.223 | N10 = 1.53607 |
| R18 = −236.191 | D18 = 0.166 | |
| R19 = 487.323 | D19 = 26.099 | N11 = 1.53607 |
| R20 = −468.313 | D20 = 39.652 | |
| R21 = 304.311 | D21 = 33.362 | N12 = 1.53607 |
| R22 = −716.692 | D22 = 0.627 | |
| R23 = 230.393 | D23 = 30.350 | N13 = 1.53607 |
| R24 = −1013.566 | D24 = 2.491 | |
| R25 = 129.171 | D25 = 45.421 | N14 = 1.53607 |
| R26 = −265.302 | D26 = 10.087 | N15 = 1.61936 |
| R27 = 80.350 | D27 = 46.038 | |
| R28 = −127.941 | D28 = 9.788 | N16 = 1.62757 |
| R29 = 151.523 | D29 = 5.853 | |
| R30 = 409.679 | D30 = 32.322 | N17 = 1.53607 |
| R31 = −196.968 | D31 = 3.703 | |
| R32 = 87.936 | D32 = 49.116 | N18 = 1.53607 |
| R33 = −552.433 | D33 = 0.642 | |

-continued

| | | |
|---|---|---|
| R34 = 88.909 | D34 = 31.195 | N19 = 1.53607 |
| R35 = ∞ | D35 = 3.982 | |
| R36 = −171.383 | D36 = 10.117 | N20 = 1.66651 |
| R37 = ∞ | | |

$\phi_1$ (R7) = −0.0077, $\phi_2$ (R8) = −0.0022,
$\phi_1$ (R13) = −0.0042, $\phi_2$ (R14) = −0.0080,
$\phi_1'$ (R27) = −0.0077

Example 5 f = 125.51   NA = 0.55   IH = 17.8   L = 1000
OB = 209.791   SK = 15.000   λ = 365 nm

| | | |
|---|---|---|
| R1 = −160.871 | D1 = 12.500 | N1 = 1.53577 |
| R2 = −3042.237 | D2 = 37.543 | N2 = 1.68816 |
| R3 = −276.972 | D3 = 1.250 | |
| R4 = 924.249 | D4 = 26.108 | N3 = 1.70826 |
| R5 = −517.336 | D5 = 1.250 | |
| R6 = 360.906 | D6 = 27.247 | N4 = 1.70826 |
| R7 = −1284.981 | D7 = 1.250 | |
| R8 = 291.736 | D8 = 51.175 | N5 = 1.64177 |
| R9 = −123.660 | D9 = 22.935 | N6 = 1.64035 |
| R10 = 75.015 | D10 = 31.102 | |
| R11 = −136.141 | D11 = 12.500 | N7 = 1.53577 |
| R12 = 198.932 | D12 = 1.250 | |
| R13 = 156.713 | D13 = 75.896 | N8 = 1.69377 |
| R14 = −135.199 | D14 = 4.396 | |
| R15 = −108.356 | D15 = 12.500 | N9 = 1.55881 |
| R16 = 174.685 | D16 = 33.885 | |
| R17 = −80.542 | D17 = 12.500 | N10 = 1.66640 |
| R18 = 1057.599 | D18 = 43.876 | N11 = 1.53577 |
| R19 = −136.636 | D19 = 1.250 | |
| R20 = −350.875 | D20 = 26.069 | N12 = 1.65599 |
| R21 = −195.286 | D21 = 1.250 | |
| R22 = 1984.422 | D22 = 38.999 | N13 = 1.60189 |
| R23 = −258.154 | D23 = 1.250 | |
| R24 = 361.244 | D24 = 34.469 | N14 = 1.67717 |
| R25 = −1057.393 | D25 = 1.250 | |
| R26 = 196.491 | D26 = 35.213 | N15 = 1.60763 |
| R27 = 1206.640 | D27 = 1.250 | |
| R28 = 137.471 | D28 = 54.194 | N16 = 1.53577 |
| R29 = −609.635 | D29 = 12.500 | N17 = 1.67508 |
| R30 = 90.424 | D30 = 18.571 | |
| R31 = 11044.575 | D31 = 12.500 | N18 = 1.66640 |
| R32 = 98.328 | D32 = 12.241 | |
| R33 = 592.755 | D33 = 17.335 | N19 = 1.70826 |
| R34 = −435.824 | D34 = 1.250 | |
| R35 = 95.932 | D35 = 73.213 | N20 = 1.62930 |
| R36 = 124.190 | D36 = 1.250 | |
| R37 = 58.297 | D37 = 21.991 | N21 = 1.57066 |
| R38 = ∞ | | |

$\phi_1$ (R10) = −0.0085, $\phi_2$ (R11) = −0.0039,
$\phi_1$ (R16) = −0.0032, $\phi_2$ (R17) = −0.0081,
$\phi_3$ (R30) = −0.0075

Example 6 f = 125.49   NA = 0.45   IH = 20.8   L = 1000
OB = 49.834   SK = 6.644   λ = 365 nm

| | | |
|---|---|---|
| R1 = 168.112 | D1 = 65.605 | N1 = 1.62743 |
| R2 = 887.936 | D2 = 3.384 | |
| R3 = 1461.620 | D3 = 13.289 | N2 = 1.64868 |
| R4 = 137.202 | D4 = 32.228 | |
| R5 = −467.702 | D5 = 13.289 | N3 = 1.58675 |
| R6 = 314.339 | D6 = 38.655 | |
| R7 = 564.420 | D7 = 29.068 | N4 = 1.66640 |
| R8 = −333.913 | D8 = 0.166 | |
| R9 = 290.824 | D9 = 25.751 | N5 = 1.66640 |
| R10 = −1710.394 | D10 = 0.166 | |
| R11 = 144.337 | D11 = 26.999 | N6 = 1.66640 |
| R12 = 424.669 | D12 = 13.289 | N7 = 1.62743 |
| R13 = 80.696 | D13 = 25.985 | |
| R14 = −1722.441 | D14 = 13.289 | N8 = 1.53577 |
| R15 = 278.635 | D15 = 27.968 | |
| R16 = −202.476 | D16 = 30.050 | N9 = 1.53577 |
| R17 = −140.629 | D17 = 0.532 | |
| R18 = −363.277 | D18 = 13.289 | N10 = 1.62743 |
| R19 = 218.903 | D19 = 29.504 | |
| R20 = −83.243 | D20 = 13.289 | N11 = 1.66640 |
| R21 = 283.775 | D21 = 54.746 | N12 = 1.53577 |
| R22 = −148.014 | D22 = 0.238 | |
| R23 = −1124.876 | D23 = 22.658 | N13 = 1.53577 |
| R24 = −318.918 | D24 = 0.166 | |
| R25 = −1458.495 | D25 = 24.222 | N14 = 1.53577 |

-continued

| | | |
|---|---|---|
| R26 = −330.471 | D26 = 0.166 | |
| R27 = 755.829 | D27 = 36.611 | |
| R28 = −278.914 | D28 = 0.166 | |
| R29 = 255.070 | D29 = 29.666 | N16 = 1.62743 |
| R30 = 5559.544 | D30 = 0.252 | |
| R31 = 142.643 | D31 = 73.127 | N17 = 1.53577 |
| R32 = −338.766 | D32 = 13.289 | N18 = 1.63609 |
| R33 = 83.174 | D33 = 19.323 | |
| R34 = −230.675 | D34 = 13.289 | N19 = 1.63609 |
| R35 = 165.095 | D35 = 6.212 | |
| R36 = 966.343 | D36 = 46.467 | N20 = 1.66645 |
| R37 = −306.352 | D37 = 0.166 | |
| R38 = 153.907 | D38 = 90.916 | N21 = 1.62743 |
| R39 = 384.718 | D39 = 0.166 | |
| R40 = 95.792 | D40 = 26.859 | N22 = 1.53577 |
| R41 = ∞ | D41 = 0.166 | |
| R42 = 98.954 | D42 = 51.658 | N23 = 1.61935 |
| R43 = 926.333 | D43 = 3.877 | |
| R44 = −272.350 | D44 = 13.289 | N24 = 1.66640 |
| R45 = ∞ | | |

$\phi_1$ (R13) = −0.0078, $\phi_2$ (R16) = −0.0027,
$\phi_1$ (R19) = −0.0029, $\phi_2$ (R20) = −0.0080,
$\phi_3$ (R33) = −0.0077

Example 7 f = 92.56  NA = 0.48  IH = 18.1  L = 1000
OB = 150.000  SK = 15.046  λ = 248 nm

| | | |
|---|---|---|
| R1 = 1439.092 | D1 = 13.876 | N1 = 1.50838 |
| R2 = −960.360 | D2 = 0.125 | |
| R3 = 666.083 | D3 = 12.500 | N2 = 1.50838 |
| R4 = 182.084 | D4 = 14.112 | |
| R5 = 1896.200 | D5 = 12.500 | N3 = 1.50838 |
| R6 = 212.178 | D6 = 66.696 | |
| R7 = 383.213 | D7 = 26.225 | N4 = 1.50838 |
| R8 = −405.603 | D8 = 0.125 | |
| R9 = 278.896 | D9 = 25.759 | N5 = 1.50838 |
| R10 = −671.954 | D10 = 0.125 | |
| R11 = 212.136 | D11 = 33.976 | N6 = 1.50838 |
| R12 = −543.385 | D12 = 0.125 | |
| R13 = 2010.730 | D13 = 12.500 | N7 = 1.50838 |
| R14 = 84.549 | D14 = 33.039 | |
| R15 = −124.255 | D15 = 12.500 | N8 = 1.50838 |
| R16 = 152.113 | D16 = 19.745 | |
| R17 = 1275.450 | D17 = 13.050 | N9 = 1.50838 |
| R18 = −627.003 | D18 = 15.823 | |
| R19 = 732.677 | D19 = 17.262 | N10 = 1.50838 |
| R20 = −393.765 | D20 = 0.125 | |
| R21 = 449.220 | D21 = 26.819 | N11 = 1.50838 |
| R22 = −178.779 | D22 = 53.499 | |
| R23 = 365.033 | D23 = 12.500 | N12 = 1.50838 |
| R24 = 118.635 | D24 = 25.300 | |
| R25 = −99.983 | D25 = 38.782 | N13 = 1.50838 |
| R26 = 1359.503 | D26 = 37.528 | |
| R27 = −922.878 | D27 = 40.110 | N14 = 1.50838 |
| R28 = −201.836 | D28 = 0.125 | |
| R29 = 1275.499 | D29 = 29.638 | N15 = 1.50838 |
| R30 = −257.024 | D30 = 0.125 | |
| R31 = 326.989 | D31 = 30.482 | N16 = 1.50838 |
| R32 = −661.938 | D32 = 0.125 | |
| R33 = 177.265 | D33 = 26.480 | N17 = 1.50838 |
| R34 = 500.907 | D34 = 0.125 | |
| R35 = 121.991 | D35 = 61.152 | N18 = 1.50838 |
| R36 = 70.628 | D36 = 26.894 | |
| R37 = −1299.508 | D37 = 12.500 | N19 = 1.50838 |
| R38 = 2084.322 | D38 = 0.125 | |
| R39 = 60.854 | D39 = 14.152 | N20 = 1.50838 |
| R40 = 62.437 | D40 = 11.022 | |
| R41 = 134.373 | D41 = 27.397 | N21 = 1.50838 |
| R42 = 133.048 | D42 = 0.125 | |
| R43 = 68.073 | D43 = 16.337 | N22 = 1.50838 |
| R44 = 356.069 | D44 = 3.427 | |
| R45 = −286.670 | D45 = 10.000 | N23 = 1.50838 |
| R46 = 7501.444 | | |

$\phi_1$ (R14) = −0.0060, $\phi_2$ (R15) = −0.0041,
$\phi_1$ (R24) = −0.0043, $\phi_2$ (R25) = −0.0051,
$\phi_3$ (R36) = −0.0072

Example 8 f = 91.09  NA = 0.48  IH = 18.1  L = 1000
OB = 136.341  SK = 14.812  λ = 248 nm

| | | |
|---|---|---|
| R1 = 1332.715 | D1 = 19.816 | N1 = 1.50838 |
| R2 = −565.036 | D2 = 0.125 | |
| R3 = 1213.556 | D3 = 12.500 | N2 = 1.50838 |
| R4 = 178.094 | D4 = 17.614 | |
| R5 = 1737.407 | D5 = 12.500 | N3 = 1.50838 |
| R6 = 217.577 | D6 = 68.375 | |
| R7 = 398.868 | D7 = 27.700 | N4 = 1.50838 |
| R8 = −414.411 | D8 = 0.125 | |
| R9 = 273.365 | D9 = 24.060 | N5 = 1.50838 |
| R10 = −694.657 | D10 = 0.125 | |
| R11 = 214.700 | D11 = 32.882 | N6 = 1.50838 |
| R12 = −521.898 | D12 = 1.060 | |
| R13 = 3636.652 | D13 = 12.500 | N7 = 1.50838 |
| R14 = 85.823 | D14 = 31.825 | |
| R15 = −124.767 | D15 = 12.500 | N8 = 1.50838 |
| R16 = 151.401 | D16 = 19.805 | |
| R17 = 1233.963 | D17 = 13.092 | N9 = 1.50838 |
| R18 = −631.567 | D18 = 15.843 | |
| R19 = 703.428 | D19 = 17.030 | N10 = 1.50838 |
| R20 = −402.530 | D20 = 0.125 | |
| R21 = 442.276 | D21 = 29.028 | N11 = 1.50838 |
| R22 = −180.319 | D22 = 52.693 | |
| R23 = 362.711 | D23 = 12.500 | N12 = 1.50838 |
| R24 = 118.168 | D24 = 25.749 | |
| R25 = −100.287 | D25 = 38.227 | N13 = 1.50838 |
| R26 = 1003.801 | D26 = 37.669 | |
| R27 = −1240.566 | D27 = 40.379 | N14 = 1.50838 |
| R28 = −203.209 | D28 = 0.404 | |
| R29 = 1276.499 | D29 = 30.364 | N15 = 1.50838 |
| R30 = −257.384 | D30 = 0.125 | |
| R31 = 321.056 | D31 = 29.361 | N16 = 1.50838 |
| R32 = −691.355 | D32 = 0.125 | |
| R33 = 172.662 | D33 = 30.058 | N17 = 1.50838 |
| R34 = 466.284 | D34 = 0.125 | |
| R35 = 119.054 | D35 = 55.556 | N18 = 1.50838 |
| R36 = 70.157 | D36 = 26.680 | |
| R37 = −1400.393 | D37 = 12.500 | N19 = 1.50838 |
| R38 = 1663.520 | D38 = 0.125 | |
| R39 = 60.955 | D39 = 14.621 | N20 = 1.50838 |
| R40 = 62.656 | D40 = 11.601 | |
| R41 = 137.312 | D41 = 28.753 | N21 = 1.50838 |
| R42 = 131.425 | D42 = 0.125 | |
| R43 = 68.465 | D43 = 18.479 | N22 = 1.50838 |
| R44 = 434.028 | D44 = 2.997 | |
| R45 = −244.457 | D45 = 10.000 | N23 = 1.50838 |
| R46 = −4672.849 | | |

$\phi_1$ (R14) = −0.0059, $\phi_2$ (R15) = −0.0041,
$\phi_1$ (R24) = −0.0043, $\phi_2$ (R25) = −0.0051,
$\phi_3$ (R36) = −0.0073

Example 9 f = 1301.98  NA = 0.48  IH = 14.5  L = 1000
OB = 163.364  SK = 12.420  λ = 248 nm

| | | |
|---|---|---|
| R1 = 785.237 | D1 = 10.000 | N1 = 1.50838 |
| R2 = 226.496 | D2 = 35.207 | |
| R3 = 338.103 | D3 = 33.119 | N2 = 1.50838 |
| R4 = −427.697 | D4 = 0.100 | |
| R5 = 220.682 | D5 = 32.878 | N3 = 1.50838 |
| R6 = −1689.440 | D6 = 0.100 | |
| R7 = 538.565 | D7 = 16.636 | N4 = 1.50838 |
| R8 = −2998.116 | D8 = 42.310 | |
| R9 = 1798.948 | D9 = 43.869 | N5 = 1.50838 |
| R10 = 86.594 | D10 = 28.437 | |
| R11 = −191.459 | D11 = 10.000 | N6 = 1.50838 |
| R12 = −365.426 | D12 = 6.206 | |
| R13 = 205.426 | D13 = 21.847 | N7 = 1.50838 |
| R14 = −235.078 | D14 = 0.100 | |
| R15 = 140.249 | D15 = 29.042 | N8 = 1.50838 |
| R16 = 71.962 | D16 = 23.223 | |
| R17 = −103.352 | D17 = 10.000 | N9 = 1.50838 |
| R18 = 291.836 | D18 = 21.563 | |
| R19 = −169.640 | D19 = 13.859 | N10 = 1.50838 |
| R20 = −146.345 | D20 = 1.260 | |
| R21 = 548.483 | D21 = 14.130 | N11 = 1.50838 |
| R22 = −286.748 | D22 = 0.100 | |
| R23 = 370.410 | D23 = 17.795 | N12 = 1.50838 |
| R24 = −192.733 | D24 = 0.100 | |
| R25 = 289.711 | D25 = 46.190 | N13 = 1.50838 |
| R26 = 98.118 | D26 = 23.251 | |
| R27 = −93.137 | D27 = 27.168 | N14 = 1.50838 |
| R28 = 696.410 | D28 = 35.100 | |
| R29 = −2198.585 | D29 = 41.200 | N15 = 1.50838 |

-continued

| | | |
|---|---|---|
| R30 = −183.512 | D30 = 5.455 | |
| R31 = 960.840 | D31 = 28.000 | N16 = 1.50838 |
| R32 = −248.042 | D32 = 0.100 | |
| R33 = 283.931 | D33 = 29.471 | N17 = 1.50838 |
| R34 = −582.356 | D34 = 0.100 | |
| R35 = 149.928 | D35 = 37.042 | N18 = 1.50838 |
| R36 = 467.490 | D36 = 0.481 | |
| R37 = 97.951 | D37 = 50.000 | N19 = 1.50838 |
| R38 = 62.066 | D38 = 20.697 | |
| R39 = 8857.666 | D39 = 10.000 | N20 = 1.50838 |
| R40 = 239.275 | D40 = 0.100 | |
| R41 = 86.347 | D41 = 11.242 | N21 = 1.50838 |
| R42 = 117.960 | D42 = 0.100 | |
| R43 = 96.904 | D43 = 19.741 | N22 = 1.50838 |
| R44 = 79.928 | D44 = 1.583 | |
| R45 = 61.664 | D45 = 14.024 | N23 = 1.50838 |
| R46 = 2778.127 | D46 = 2.290 | |
| R47 = −193.684 | D47 = 9.000 | N24 = 1.50838 |
| R48 = 543.831 | | |

$\phi_1$ (R10) = −0.0058, $\phi_2$ (R11) = −0.0027,
$\phi_1$ (R16) = −0.0036, $\phi_2$ (R17) = −0.0071,
$\phi_1$ (R26) = −0.0052, $\phi_2$ (R27) = −0.0055,
$\phi_3$ (R38) = −0.0082

The abbreviations referred to in the examples stand for: R: curvature of each surface, D: surface separation, N: refractive index, f: focal length of the overall lens system, NA: imagewise numerical aperture, L: distance between object and image, OB: object position, SK: image position, λ: reference wavelength, and $\phi(R)$: refractive power of that surface.

How aberrations are corrected in the 1st to 9th embodiments is illustrated in FIGS. 10A to 10F through 18A to 18F.

As explained above, the present invention can successfully provide a projection lens system having wide exposure coverage and resolving power that is high in a sense of being corrected to substantially aplanatic conditions.

What is claimed is:

1. A projection lens system comprising:
   first and second lens groups, each of said first and second lens groups including lens components having concave surfaces located opposite to each other;
   at least one lens component having a surface with a positive refractive power disposed between said first and second lens groups; and
   a third lens group disposed on an object side of said first and second lens groups and having at least two lens components each with a positive refractive power.

2. A projection lens system as claimed in claim 1, wherein a distance between an object and an image has a specific value, and said first and second lens groups satisfy the following conditions (1) and (2)

$$1/L < |\phi_1| < 20/L \quad (1)$$

$$1/L < |\phi_2| < 20/L \quad (2)$$

where $\phi_1$ and $\phi_2$ represent respective negative refractive powers of said facing concave surfaces, and L is said distance between said object and said image.

3. A projection lens system as claimed in claim 2, wherein a lens component having a concave surface on an image side is disposed on said image side of said first and second lens groups, said concave surface satisfying the following condition (5):

$$1/L < |\phi_3| < 20/L \quad (5)$$

where $\phi_3$ is a refractive power of said concave surface.

4. A projection lens system as claimed in claim 3, further comprising a sixth lens group including at least one lens component having a negative refractive power disposed on said object side of said first and second lens groups.

5. A projection lens system as claimed in claim 4, further comprising a seventh lens group, said seventh lens group including lens components having concave surfaces located opposite to each other.

6. A projection lens system as claimed in claim 5, wherein all lens elements are formed of a same vitreous material.

7. A projection lens system as claimed in claim 4, wherein all lens elements are formed of a same vitreous material.

8. A projection lens system as claimed in claim 3, further comprising a seventh lens group, said seventh lens group including lens components having concave surfaces located opposite to each other.

9. A projection lens system as claimed in claim 8, wherein all lens elements are formed of a same vitreous material.

10. A projection lens system as claimed in claim 3, wherein all lens elements are formed of a same vitreous material.

11. A projection lens system as claimed in claim 2, further comprising a sixth lens group including at least one lens component having a negative refractive power disposed on said object side of said first and second lens groups.

12. A projection lens system as claimed in claim 11, further comprising a seventh lens group, said seventh lens group including lens components having concave surfaces located opposite to each other.

13. A projection lens system as claimed in claim 12, wherein all lens elements are formed of a same vitreous material.

14. A projection lens system as claimed in claim 11, wherein all lens elements are formed of a same vitreous material.

15. A projection lens system as claimed in claim 2, further comprising a seventh lens group, said seventh lens group including lens components having concave surfaces located opposite to each other.

16. A projection lens system as claimed in claim 15, wherein all lens elements are formed of a same vitreous material.

17. A projection lens system as claimed in claim 2, wherein all lens elements are formed of a same vitreous material.

18. A projection lens system as claimed in claim 2, further comprising:
   a fourth lens group having a positive refractive power and including at least two lens components having a positive refractive power disposed between said first and second lens groups;
   said fourth lens group satisfying the following condition (3):

$$f < L/4 \quad (3)$$

where f is a composite focal length of said fourth lens group.

19. A projection lens system as claimed in claim 18, wherein all lens elements are formed of a same vitreous material.

20. A projection lens system as claimed in claim 18, further comprising a fifth lens group including at least four lens components having a positive refractive power disposed on an image side of said first and second lens units.

21. A projection lens system as claimed in claim 20, further comprising a sixth lens group including at least one lens component having a negative refractive power disposed on said object side of said first and second lens groups.

22. A projection lens system as claimed in claim 21, further comprising a seventh lens group, said seventh lens group including lens components having concave surfaces located opposite to each other.

23. A projection lens system as claimed in claim 22, wherein all lens elements are formed of a same vitreous material.

24. A projection lens system as claimed in claim 21, wherein all lens elements are formed of a same vitreous material.

25. A projection lens system as claimed in claim 20, further comprising a seventh lens group, said seventh lens group including lens components having concave surfaces located opposite to each other.

26. A projection lens system as claimed in claim 25, wherein all lens elements are formed of a same vitreous material.

27. A projection lens system as claimed in claim 20, wherein all lens elements are formed of a same vitreous material.

28. A projection lens system as claimed in claim 20, wherein a lens component having a concave surface on an image side is disposed on said image side of said first and second lens groups, and said concave surface satisfies the following condition (4):

$$1/L < |\phi_3| < 20/L \qquad (4)$$

where $\phi_3$ is a refractive power of said concave surface.

29. A projection lens system as claimed in claim 28, wherein a sixth lens group including at least one lens component having a negative refractive power is disposed on said object side of said first and second lens groups.

30. A projection lens system as claimed in claim 29, wherein all lens elements are formed of a same vitreous material.

31. A projection lens system as claimed in claim 29, further comprising a seventh lens group, said seventh lens group including lens components having concave surfaces located opposite to each other.

32. A projection lens system as claimed in claim 31, wherein all lens elements are formed of a same vitreous material.

33. A projection lens system as claimed in claim 28, wherein all lens elements are formed of a same vitreous material.

34. A projection lens system as claimed in claim 28, further comprising a seventh lens group, said seventh lens group including lens components having concave surfaces located opposite to each other.

35. A projection lens system as claimed in claim 34, wherein all lens elements are formed of a same vitreous material.

36. A projection lens system comprising:
   first and second lens groups, each of said first and second lens groups including lens components having concave surfaces located opposite to each other; and
   a third lens group disposed on an object side of said first and second lens groups and having at least two lens components each with a positive refractive power.

* * * * *